(12) United States Patent
Stimmann

(10) Patent No.: US 6,720,902 B2
(45) Date of Patent: Apr. 13, 2004

(54) HIGH DYNAMIC RANGE DIGITAL CONVERTER

(75) Inventor: Eric Stimmann, San Jose, CA (US)

(73) Assignee: Amersham Biosciences (SU) Corp, Sunnyvale, CA (US)

( * ) Notice: Subject to any disclaimer, the term of this patent is extended or adjusted under 35 U.S.C. 154(b) by 0 days.

(21) Appl. No.: 10/163,733

(22) Filed: Jun. 6, 2002

(65) Prior Publication Data

US 2003/0102994 A1 Jun. 5, 2003

Related U.S. Application Data

(60) Provisional application No. 60/300,736, filed on Jun. 25, 2001, provisional application No. 60/300,735, filed on Jun. 25, 2001, and provisional application No. 60/297,109, filed on Jun. 8, 2001.

(51) Int. Cl.[7] .............................................. H03M 1/36
(52) U.S. Cl. ....................................... 341/159; 341/141
(58) Field of Search .................................. 341/159, 141, 341/139, 120, 155

(56) References Cited

U.S. PATENT DOCUMENTS

| 5,422,643 A | * | 6/1995 | Chu et al. ..................... 341/141 |
| 5,684,480 A | * | 11/1997 | Jansson ....................... 341/139 |
| 5,757,440 A | * | 5/1998 | Mangelsdorf ............... 348/697 |

* cited by examiner

*Primary Examiner*—Brian Young
*Assistant Examiner*—Joseph Lauture
(74) *Attorney, Agent, or Firm*—Yonggang Ji; Royal N. Ronning, Jr.; Stephen G. Ryan

(57) ABSTRACT

The present invention provides a single analog-to-digital converter system which is capable of converting an input signal having a high dynamic range into a digital signal which is within the range of the analog-to-digital converter. Additionally, the present invention provides an analog-to-digital converter which is capable of converting an input signal having a high dynamic range into a digital signal by controlling the amplification of the signal to achieve the optimal gain that falls within the range of the analog-to-digital converter.

10 Claims, 3 Drawing Sheets

HIGH DYNAMIC RANGE DIGITAL CONVERTER

CROSS-REFERENCE TO RELATED APPLICATIONS

This application claims priority to Provisional Application No. 60/297,109 filed on Jun. 8, 2001 and entitled "Six Order Board"; Provisional Application No. 60/300,735 filed on Jun. 25, 2001 and entitled "Variable Nth Order Dynamic Range Transimpedance Amplifier Digital Converter System"; and Provisional Application No. 60/300,736 filed on Jun. 25, 2001 and entitled "Single Conversion Optimized Programmably Variable Gain Nth Order Dynamic Range Transimpedance Amplifier Digital Converter System".

FIELD OF THE INVENTION

The present invention provides a high dynamic range digital converter. More, particularly, the present invention provides a variable gain digital converter system which is suitable for digitizing signals that have high dynamic range such as signals in photon detection systems or other various applications.

BACKGROUND OF THE INVENTION

In general, there are problems in digitizing a signal having a high dynamic range. First, the range of signals levels over a high dynamic range signal can saturate the analog-to-digital converter and/or the amplifier in the receiver stage of the photon detection system. In the past, known photon detection systems typically amplify such signal prior to analog-to-digital conversion in order to improve the signal to noise (S/N) ratio. Secondly, to cover the typical high dynamic range of the photon detection system, at least four or more 16-bit analog-to-digital converters are required per amplifier, which is very costly. The use of a single 20-bit A/D converter to cover the high dynamic range adds substantial cost, complexity, and is typically too slow to be effective. In addition, the use of multiple analog-to-digital converters requires processing multiple signals to determine which converter is in range, thereby increasing system complexity and making it more difficult to calibrate.

Accordingly, what is required is a single analog-to-digital converter system which is capable of converting an input signal having a high dynamic range into a digital signal which consumes less time and is cost effective.

SUMMARY OF THE INVENTION

The present invention provides a single analog-to-digital converter which is capable of converting an input signal having a high dynamic range into a digital signal which is within the range of the analog-to-digital converter. Additionally, the present invention provides an analog-to-digital converter which is capable of converting an input signal having a high dynamic range into a digital signal by controlling the amplification of the signal to achieve the optimal gain that falls within the range of the analog-to-digital converter.

In accordance with one embodiment of the present invention, there is provided an apparatus for amplifying signals of high dynamic range having an amplifier bank where the amplifier bank has an input for receiving an analog signal and having a plurality of channels, where each channel includes an output for producing an amplified signal corresponding to the analog signal; a switch coupled to the output of the amplifier bank and having a switch output and producing at the switch output one of the amplified signal; a comparator bank including an output port and having an input coupled to the outputs of the channels in the amplifier bank and to reference voltage signals; a microprocessor coupled to the switch and to the output port of the comparator bank for controlling the switch to select one of the amplified signal; and an analog-to-digital converter having an analog input coupled to the switch output for receiving the amplified signal and including a data output port, and converting the selected amplified signal into a digital signal for output at the data output port.

In accordance with the second embodiment of the present invention, there is provided a high dynamic range digital converter system having a first programmable variable amplifier, where the first programmable variable amplifier includes a first input and first output; and for receiving an input voltage signal at the first input and producing a first attenuated voltage signal at the first output, wherein the first attenuated voltage signal represents first gain of the first programmable variable amplifier; a second programmable variable amplifier having a second output and second input, the second input being coupled to the first output of the first programmable variable amplifier for receiving the first attenuated voltage signal and for producing a second attenuated voltage signal at the second output, said second attenuated voltage signal representing a second gain of the second programmable variable amplifier; an analog-to-digital converter having an output port and an input port, the input port being coupled to the second output of the second programmable variable amplifier and for converting the second attenuated voltage signal to a digital signal at the output port; and microprocessor coupled to the output port of the analog-to-digital converter for receiving the digital signal and the microprocessor coupled to the first and second programmable variable amplifiers for controlling the first and second gain.

In accordance with the third embodiment of the present invention, there is provided a high dynamic range digital converter system having a first programmable variable amplifier, where the first programmable variable amplifier has a first input and first output; and for receiving an input voltage signal at the first input and producing a first attenuated voltage signal at the first output, the first attenuated voltage signal representing a first gain of the first programmable variable amplifier; a second programmable variable amplifier having a second output and second input, the second input being coupled to the first output of the first programmable variable amplifier for receiving the first attenuated voltage signal and for producing a second attenuated voltage signal at the second output, the second attenuated voltage signal representing a second gain of the second programmable variable amplifier; a comparator bank including an output port and having an input port for receiving input voltage signal and reference voltage signals; a microprocessor coupled to the first and second programmable variable amplifiers and to the output port of the comparator bank for controlling the first and second programmable variable amplifiers to adjust the first and second gain; and an analog-to-digital converter having an output and input, the input being coupled to the second output of the second programmable variable amplifier, and for converting the second attenuated voltage signal to a digital signal based upon the adjusted first and second gain.

DETAILED DESCRIPTION OF THE PREFERRED EMBODIMENT

Figure 1:
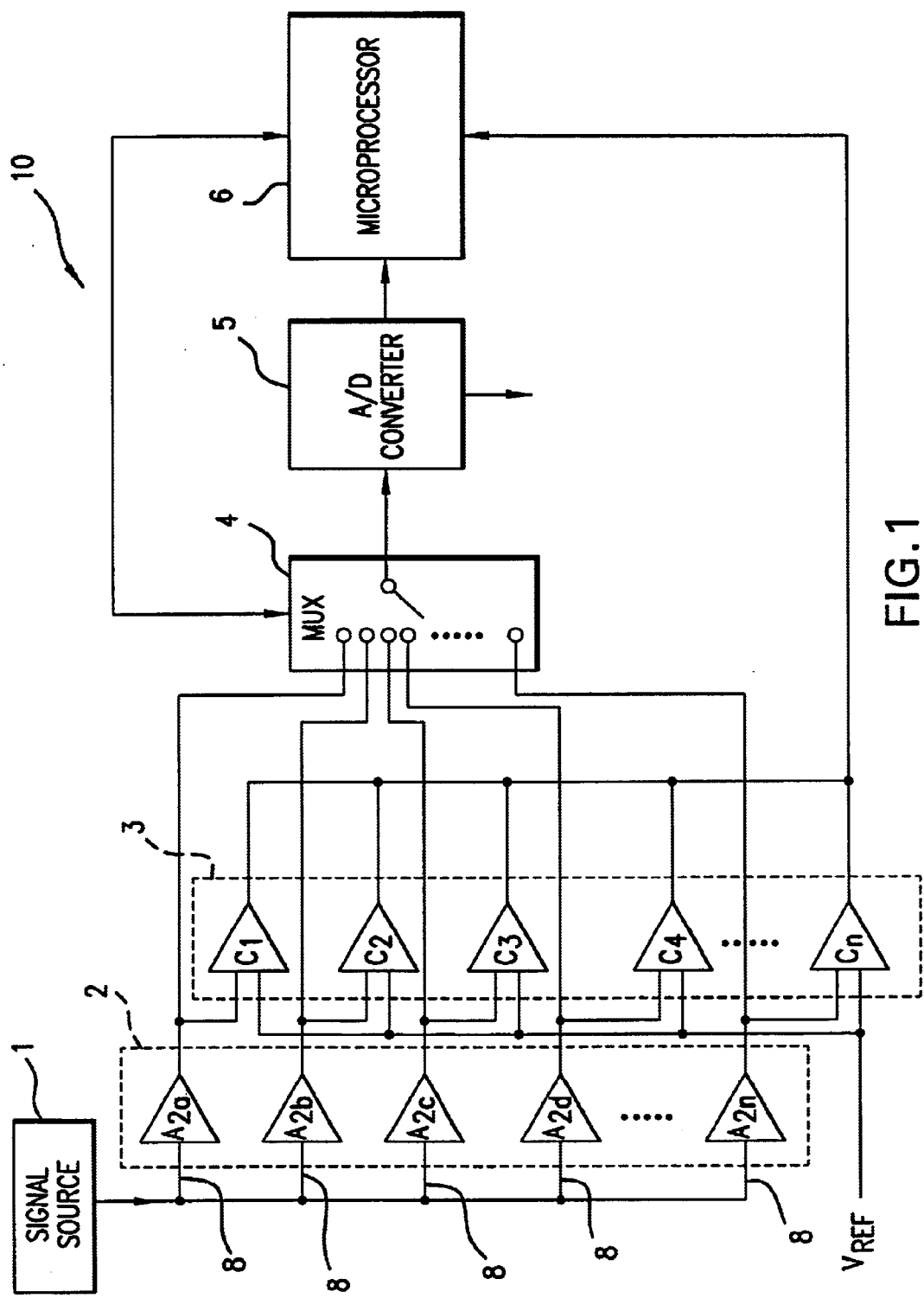
FIG. 1 shows, in block diagram form, a preferred apparatus implementation of the present invention.

FIG. 1 shows, in block diagram form, a high dynamic range digital converter 10, according to the present invention. The converter 10 includes a signal source 1, amplifier bank 2, comparator bank 3, an analog multiplexer 4, an analog-to-digital converter (A/D) 5 and a microprocessor 6.

The signal source 1 can be typically any transducer system such as a photomultiplier tube used for detection of photons. The analog signal received from the signal source 1 is fed into the amplifier bank 2. The amplifier bank 2 includes n channels 8 wherein each channel provides a different gain factor or attenuation coefficient. The amplifier bank 2 amplifies or attenuates the analog signal so that it falls within the range of the A/D converter 5. For example, if the level of the analog signal is saturated, i.e., above the maximum input range of A/D converter 5, then the amplifier bank 2 will attenuate the signal to produce an attenuated analog signal which is within the range of the A/D converter 6. If, on the other hand, the signal is very weak, nearly zeroed, i.e., close to the minimum input range of A/D converter 5, then the amplifier bank 2 will amplify the signal to produce an amplified analog signal for greater resolution.

The number of channels 3 in the amplifier bank 2 will depend on the dynamic range of the analog signal and the precision of the A/D converter 5.

The output signal of each amplifier $2a, 2b, 2c, 2d \ldots 2n$ provides an input to the analog multiplexer 4. The multiplexer 4 selects the output signal of the amplifier which is within the range of the A/D converter 5, i.e., the signal which is neither saturated nor zeroed. The output of the multiplexer 4 is connected to the input of the A/D converter 5 and the input select line is connected to an Input/Output port on the microprocessor 6. The multiplexer 4 which is simply an analog switch is controlled by the microprocessor 6 to select and route one of the output signals of the amplifier to the input of the A/D converter 5. By selecting the output signal of the amplifier which falls within the range of the A/D converter 5, that output signal is then converted into a digital signal without saturating the A/D converter 5. The A/D converter 5 converts the output signal into a digital signal. The digital signal is then available for further processing to the outside world.

A key aspect of the present invention involves selecting a channel 8 for which the output signal of the amplifier is close to the full range of the A/D converter 5. Referring again to FIG. 1, the converter 10 includes a bank of comparators 3 which determines which channel 8 in the amplifier bank 2 is within range of the A/D converter 5, i.e., the channel 8 that will not be saturate the A/D converter 5. Once that channel is found, the microprocessor 6 uses the multiplexer 4 to switch that channel 8 to the A/D converter 5. The comparators 3 provide the microprocessor 6 with a "sneak peek" function which commands the multiplexer to select the amplifier 2 with the highest non-saturated signal. Therefore, the system will switch the multiplexer 4 to the optimum amplifier 2 and then the A/D converter 5 will begin its conversion.

Referring further to FIG. 1, the non-inverting input of each of the comparators 3 is connected to the output of each amplifier 2 and the inverting input of the comparator 3 is connected to an individual reference voltage $Ref_1, Ref_2 \ldots Ref_n$. Comparators 3 act as level detectors. For the analog signals with minimum input which are reading voltage close to the range of the A/D converter 5, the comparators 3 will produce a logic low output, thereby outputting all "zeros", i.e., logic zeros. For the analog signals which are reading voltage above the maximum input range of the A/D converter 5, the comparators 3 will produce a logic high output, thereby outputting all "ones", i.e., logic ones. Since the number of comparators are n, the number of comparator output states will be n+1. Therefore, for the system shown in FIG. 1, the number of comparator is n=4, then there are five possible comparator output states. The table shown below is for n=4.

| Transducer out | $C_A$ | $C_B$ | $C_C$ | $C_D$ |
|---|---|---|---|---|
| High | 0 | 0 | 0 | 0 |
| ↓ | 1 | 0 | 0 | 0 |
| ↓ | 1 | 1 | 0 | 0 |
| ↓ | 1 | 1 | 1 | 0 |
| Low | 1 | 1 | 1 | 1 |

The microprocessor 6 receives the outputs of the comparators 3, decodes the logical signal to determine which channel 8 is in range of the A/D converter 5, then further commands the multiplexer (MUX) 4 to select the appropriate channel 8 for the analog signal to be converted by A/D converter 5. This entire process eliminates the need for converting every analog signal, thereby saving the time of the intensive process of repetitive A/D conversions on channels with little or no useful information.

The above system is a calibrated system with a known signal and the A/D converter output is used to generate a lookup table. This table can be used to remove non-linearities in each of the amplifier signal paths.

Figure 2:
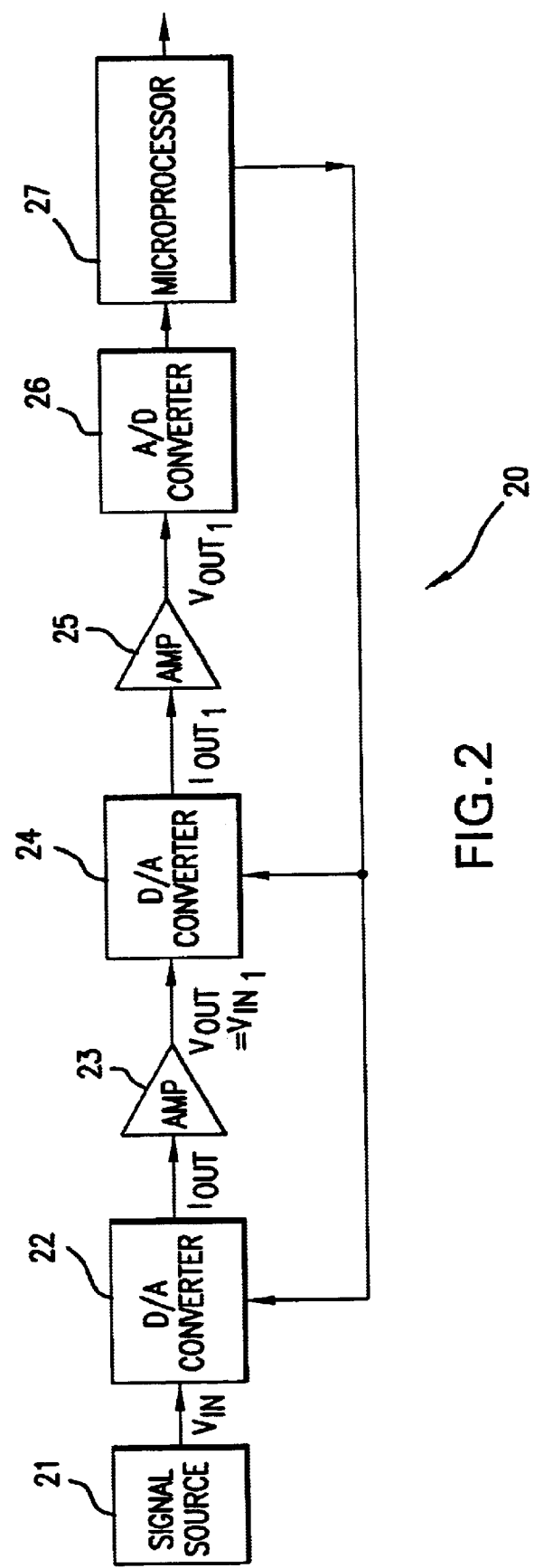
FIG. 2 shows, in block diagram form, a variable $n^{th}$ order dynamic range digital conversion system.

Referring to FIG. 2, there is shown in a block diagram form, another embodiment of the present invention illustrating a programmably variable $n^{th}$ order dynamic range converter system 20. The system 20 includes a signal source 21, digital-to-analog (DAC) converters 22 and 24, amplifiers 23 and 25, analog-to-digital converter (A/D) 26 and a microprocessor 28.

The DAC 22 receives as an input signal $V_{in}$ from a signal source 21. The DAC 22 converts the $V_{in}$ into an analog output current signal, $I_{out}$ which is proportional to $V_{in}$. The amplifier 23 converts the output current $I_{out}$ to an output Voltage, $V_{out}$ which is the input $V_{in}$ to the DAC 24. The DAC 24 converts the $V_{in1}$ into an output current signal $I_{out1}$ which is proportional to $V_{in1}$. The amplifier 25 further converts the output current $I_{out1}$ to an output $I_{out}$, to an output voltage $V_{out1}$. As such, the DACs 22 and 24 in combination with amplifiers 23 and 25 function as programmable variable amplifiers. The voltage $V_{out1}$ of amplifier 25 is digitized by the A/D converter 26 and this digitized signal is received by a microprocessor 27. Based on the digitized signal, microprocessor 27 determines what DAC amplifier gain setting needs to be selected to achieve optimum amplification gain without saturating the A/D converter 26. The microprocessor sends a command to DAC 22 and DAC 24 to increase or decrease the gain to amplify the signal to near the maximum input of the A/D converter 26. It is to be noted that the signal $V_{in}$ is amplified and the DACs attenuate down from the maximum gain. The DAC 22 and DAC 24 will adjust, up or down, the amplification to an optimum level which is further digitized by A/D converter 26 and send to microprocessor 27, which is now available for any further processing to the outside world.

As discussed, DACs 22 and 24 of FIG. 2 act as programmable attenuators. The value of output current $I_{out1}$ of the DAC 22 is proportional to the input voltage $V_{in1}$. The amplifiers 23 and 25 after each DAC 22 and 24 converts the output currents $I_{out1}$ and $I_{out2}$ to output voltages $V_{out1}$ and $V_{out2}$. Thus, the input to the DAC 22 acts as the DAC reference input. The DAC 22 and 24 can attenuate the output currents $I_{out1}$ and $I_{out2}$ respectively and therefore provide for variable gain. Each DAC 22 and 24+amplifier 23 and 25 in combination produces an output voltage $V_{out1}$ and $V_{out2}$ respectively.

For an n-bit DAC:

$$I_{out} = \frac{V_{in}}{R_{in}}\left(\frac{D_o}{2} + \frac{D_1}{4} + \ldots + \frac{D_n}{2^n}\right)$$

where $D_0, D_i, \ldots D_n$ are the digital inputs to the DAC and $R_{in}$ is the resistance value of the series resistor at the reference input to the DAC, such as $R_{in1}$ as an input to the DAC 23 and $R_{in2}$ as an input to the DAC 24. Therefore the DAC attenuates down from the maximum value being put into the reference. Normally, that reference is fixed, for example to 5 volts, then the DAC could be commanded to output 5 volts or some fraction of that. This embodiment uses the DAC to attenuate the input signal, and not some standard voltage. Finally, the DACs 22 and 24 in FIGS. 2 and 3 corresponds to the "R-2R Ladder" type DAC which is a subset of the "Binary Weighted Resistor" type. The R-2R is a commonly DAC used. Also, $$V_{in} = I_{out} * G_a$$

since $$I_{outmax} = V_{inmax}/R_{in} * ((2^n - 1)/2^n) * G_a$$

where the $G_a$ is the gain of the amplifier and the maximum amplification is achieved with large $G_a$ and lower gain can be programmed by setting the DAC inputs appropriately. The high dynamic range of the system outputs such as photomultiplier tubes (PMTs) requires very high gain at low input signals. Also, low gain is needed at high input signals to avoid saturation of the A/D converters. In order to properly amplify such signals we need an exponentially large range of gain settings. To get high gain, two or more DAC (22 and 24)+amplifier stages (23 and 25) are used as shown in FIG. 2, which allow splitting the gain between two or more amplifiers. This minimizes the effects of large single stage gains, such as lower bandwidth and higher offsets. In an experimental test, the minimum gain achieved after the signal source is 1 while the maximum gain is 32768. The optimum gain will provide the A/D with a signal near its maximum input. This is optimal because A/D errors are as a percentage of full scale, therefore smaller signals generally have larger errors.

To select optimum gain, the gain must be adjusted to amplify the signal to near the maximum input of the A/D converter. Since it is not known in advance what the input signal will be, multiple samples of the input signal are taken. For example, using a 16 bit A/D converter, should the A/D input signal give a digital output value of 0X0008, the amplification should be increased to "shift" the A/D output to 0X8000. The "shift" is governed by the following:

Amplification Gain, G $$G^T = G^{T-1} * 2^n$$

where $G_T$ is the next conversion, and $G_{T-1}$ is the initial conversion and where n is the number of leading zeroes of the first conversion. For the example of $G_{T-1}$=0X0008, the needed amplification would be $2^n$, where n–12, or 4096 times the initial conversion amplification.

The A/D output could be optimized even further by increasing gain until the output is just below A/D saturation. This is not necessary to achieve high accuracy and also would slow down the system due to the extra conversions. To minimize conversions, the first conversion of a signal should be somewhere in the middle of the amplification schedule, then the next conversion can either increase or decrease amplification as needed. The microprocessor will continually program the DACs to either the initial amplification or the optimized amplification in a continual loop.

Figure 3:
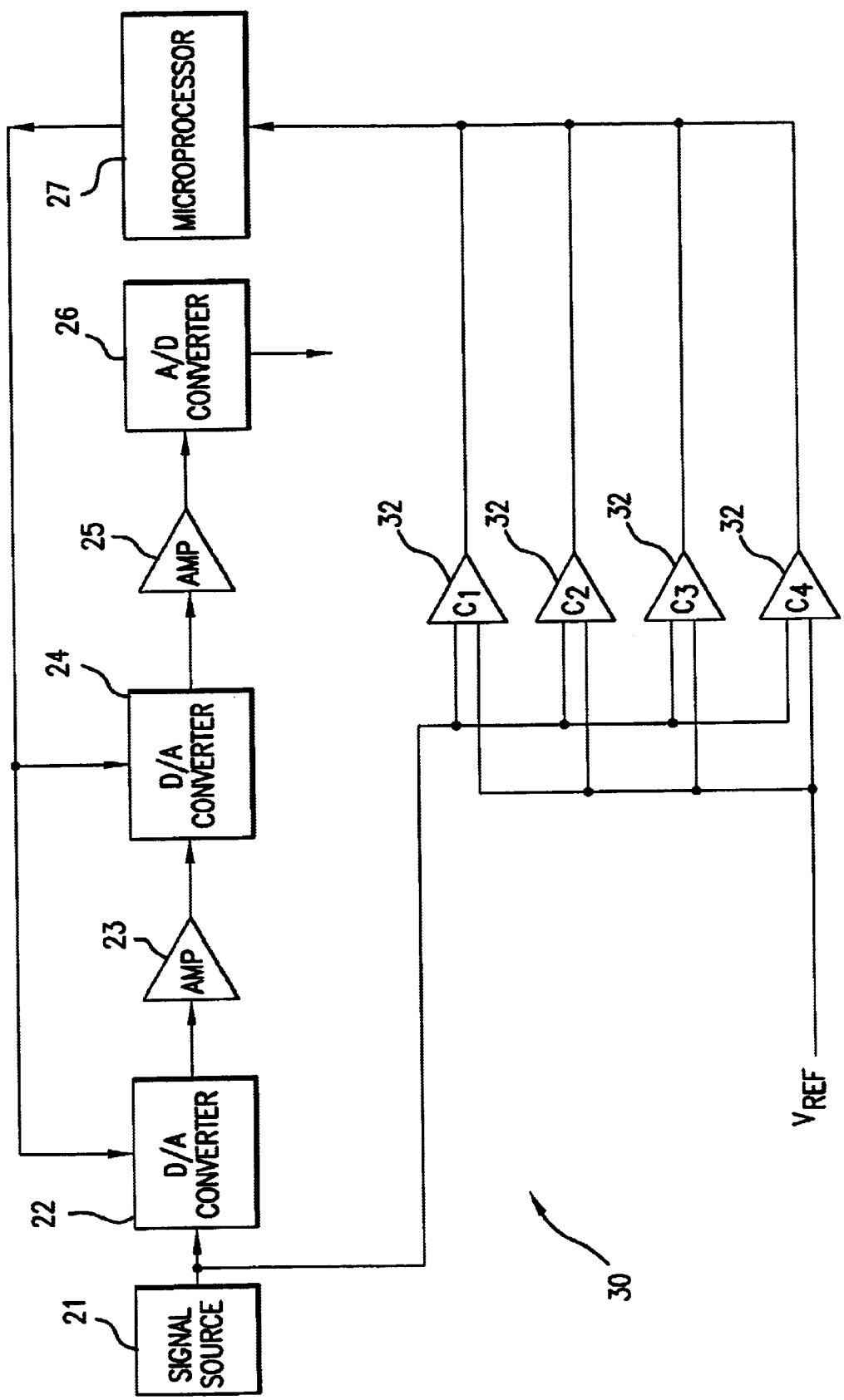
FIG. 3 shows a single conversion optimized programmable variable gain $n^{th}$ order dynamic range digital converter system.

Referring to FIG. 3, there is shown in a block diagram, a third embodiment of the present invention illustrating single conversion optimized programmably variable gain $n^{th}$ order dynamic range digital converter system 30. The system 30 includes a signal source 21, digital-to-analog converters 22 and 24, amplifiers 23, 25, analog-to-digital converter 26, a microprocessor 27, and a bank of comparators 32.

The system in FIG. 3 works similarly to the one in FIG. 2, except the microprocessor 27 in this system knows in advance what gain is nearly optimal. The microprocessor 27 need not wait until the signal is digitized by A/D converter 26 to make this determination. This determination is accomplished by a plurality of comparators 32 which receive the voltage signal directly from the signal source 21 and will produce a logical voltage output. The logical output voltages are received by the microprocessor 21 which further signals the DACs 22 and 24 to adjust their amplification gain. Gain may preferably be optimized by increasing the voltage signal output by a gain factor that brings the gain up to a level near the maximum allowed input to the A/D converter 26. In other words, the microprocessor 27 can set the each of the DACs 22 and 24 and their amplifier 23 and 25 to give near optimum gain before the A/D converter 26 begins the conversion so that only a single conversion is required at all times, per datum.

Having described the preferred embodiments herein, it should be appreciated that modifications may be made thereto without departing from the contemplated scope thereof. Accordingly, the preferred embodiments are considered illustrative rather than limiting, the true scope of the invention being set forth in the claims appended hereto.

What is claimed is:

1. A high dynamic range digital converter system comprising:
    a) a first programmable variable amplifier having a first input and first output; and for receiving an input voltage signal at the first input and producing a first attenuated voltage signal at the first output, wherein said first attenuated voltage signal represents first gain of the first programmable variable amplifier;
    b) a second programmable variable amplifier having a second output and second input, the second input being coupled to the first output of the first programmable variable amplifier for receiving said first attenuated voltage signal and for producing a second attenuated voltage signal at the second output, said second attenuated voltage signal representing a second gain of the second programmable variable amplifier;

c) an analog-to-digital converter having an output port and an input port, said input port being coupled to the second output of the second programmable variable amplifier and for converting said second attenuated voltage signal to a digital signal at the output port; and d) a microprocessor coupled to the output port of the analog-to-digital converter for receiving said digital signal and said microprocessor coupled to the first and second programmable variable amplifiers for controlling the first and second gain.

2. The system of claim 1 wherein said analog-to-digital converter has a predetermined input range and said first and second gain of first and second programmable variable amplifiers is controlled by adjusting the first and second attenuated voltage signals to bring the said first and second gain up to a level of said predetermined input range.

3. The system of claim 1 wherein said first programmable variable amplifier comprises first digital-to-analog converter and a first amplifier.

4. The system of claim 1 wherein said programmable variable amplifier comprises second digital-to-analog converter and a second amplifier.

5. A high dynamic range digital converter system comprising:

a) a first programmable variable amplifier having a first input and first output; and for receiving an input voltage signal at the first input and producing a first attenuated voltage signal at the first output, said first attenuated voltage signal representing a first gain of the first programmable variable amplifier;

b) a second programmable variable amplifier having a second output and second input, the second input being coupled to the first output of the first programmable variable amplifier for receiving said first attenuated voltage signal and for producing a second attenuated voltage signal at the second output, said second attenuated voltage signal representing a second gain of the second programmable variable amplifier;

c) a comparator bank including an output port and having an input port for receiving the input voltage signal and reference voltage signals;

d) a microprocessor coupled to the first and second programmable variable amplifiers and to the output port of the comparator bank for controlling said first and second programmable variable amplifiers to adjust the first and second gain; and e) an analog-to-digital converter having an output and input, said input being coupled to the second output of the second programmable variable amplifier, and for converting the second attenuated voltage signal to a digital signal based upon adjusted first and second gain.

6. The system of claim 5 wherein said comparator bank comprises a plurality of comparators, wherein the input port of each of the comparators is coupled to receiving the input voltage signal, and one of said reference voltage signals, and each of the output ports is coupled to the microprocessor.

7. The system of claim 6 wherein said analog-to-digital converter has a predetermined input range and said microprocessor determines which one of said output ports of the comparator are within said range.

8. The system of claim 5 wherein said first programmable variable amplifier comprises first digital-to-analog converter and a first amplifier.

9. The system of claim 5 wherein said programmable variable amplifier comprises second digital-to-analog converter and a second amplifier.

10. A high dynamic range digital converter having a predetermined input voltage range, comprising:

means for receiving analog signals including a digital-to-analog converter;

means for selecting the analog signal that has a voltage falling within said voltage range; and means for converting said selected analog signal to a digital signal.

* * * * *

UNITED STATES PATENT AND TRADEMARK OFFICE
CERTIFICATE OF CORRECTION

PATENT NO. : 6,720,902 B2
DATED : April 13, 2004
INVENTOR(S) : Eric Stimmann

It is certified that error appears in the above-identified patent and that said Letters Patent is hereby corrected as shown below:

Title page,
Item [73], Assignee, should read:
-- [73]  Assignee: Amersham Biosciences (SV) Corp,
  Sunnyvale, CA (US) --

Column 3,
Line 27, change "6" to -- 5 --.
Line 31, change "3" to -- 8 --.
Line 57, after "will not" delete "be".

Column 4,
Line 52, change "$V_{in}$" to -- $V_{in1}$ --.
Line 55, after "converts the output current $I_{out1}$ to" delete -- an output $I_{out}$, to --.

Column 5,
Line 7, "$I_{out1}$" to -- $I_{out}$ --.
Line 8, change "$V_{in1}$" to -- $V_{in}$ --.
Lines 10 and 13, change "$I_{out1}$ and $I_{out2}$" to -- $I_{out}$ and $I_{out1}$ --.
Line 10, change "$V_{out1}$" to -- $V_{out}$ --.
Line 11, change "$V_{out2}$" to -- $V_{out1}$ --.
Line 15, change "$V_{out1}$ and $V_{out2}$" to -- $V_{out}$ and $V_{out1}$ --.
Line 26, change "23" to -- 22 --.

Signed and Sealed this

Twenty-eighth Day of December, 2004

JON W. DUDAS
*Director of the United States Patent and Trademark Office*